United States Patent
Cox et al.

(10) Patent No.: US 7,138,326 B2
(45) Date of Patent: *Nov. 21, 2006

(54) WAFER INTEGRATED RIGID SUPPORT RING

(75) Inventors: Harry D. Cox, Rifton, NY (US); David P. Daniel, Burlington, VT (US); Leonard J. Gardecki, Essex, VT (US); Albert J. Gregoritsch, III, Jericho, VT (US); Ruth A. Machell Julianelle, Underhill, VT (US); Charles H. Keeler, Essex Junction, VT (US); Doris P. Pulaski, Holmes, NY (US); Mary A. Schaffer, Hopewell Junction, NY (US); David L. Smith, Pleasant Valley, NY (US); David J. Specht, Duxbury, VT (US); Adolf E. Wirsing, South Hero, VT (US)

(73) Assignee: International Business Machines Corp., Armonk, NY (US)

( * ) Notice: Subject to any disclaimer, the term of this patent is extended or adjusted under 35 U.S.C. 154(b) by 232 days.

This patent is subject to a terminal disclaimer.

(21) Appl. No.: 10/625,635

(22) Filed: Jul. 23, 2003

(65) Prior Publication Data

US 2004/0135233 A1   Jul. 15, 2004

Related U.S. Application Data

(62) Division of application No. 10/302,412, filed on Nov. 22, 2002, now Pat. No. 6,706,621, which is a division of application No. 09/422,697, filed on Oct. 21, 1999, now abandoned.

(51) Int. Cl.
    *H01L 21/44* (2006.01)
(52) U.S. Cl. ............ 438/612; 438/113; 438/614; 438/613; 438/717; 438/616; 438/128; 438/637
(58) Field of Classification Search .......... 438/612, 438/113, 614, 613, 717, 616, 128, 637
    See application file for complete search history.

(56) References Cited

U.S. PATENT DOCUMENTS 6,181,569 B1 * 1/2001 Chakravorty ............ 361/761
6,293,270 B1 * 9/2001 Okazaki .................. 125/13.01

* cited by examiner

*Primary Examiner*—Eddie Lee
*Assistant Examiner*—Junghwa Im
(74) *Attorney, Agent, or Firm*—Robert A. Walsh; Anthony J. Canale

(57) ABSTRACT

A shadow mask for depositing solder bumps includes additional dummy holes located adjacent holes corresponding to most of the perimeter chips of the wafer. The additional dummy provide more uniform plasma etching of contacts of the wafer, improve etching of contacts of perimeter chips, and lower contact resistance of contacts of perimeter chips. The extra holes also provide solder bumps outside the perimeter chips that can be used to support a second shadow mask for deposition of an additional material, such as tin, on the reflowed solder bumps for mounting the chips on a plastic substrate at low temperature. An improved mask to wafer alignment aid is formed from standard solder bumps. The improved alignment aid avoids damage to test probes and provides improved course alignment.

7 Claims, 13 Drawing Sheets

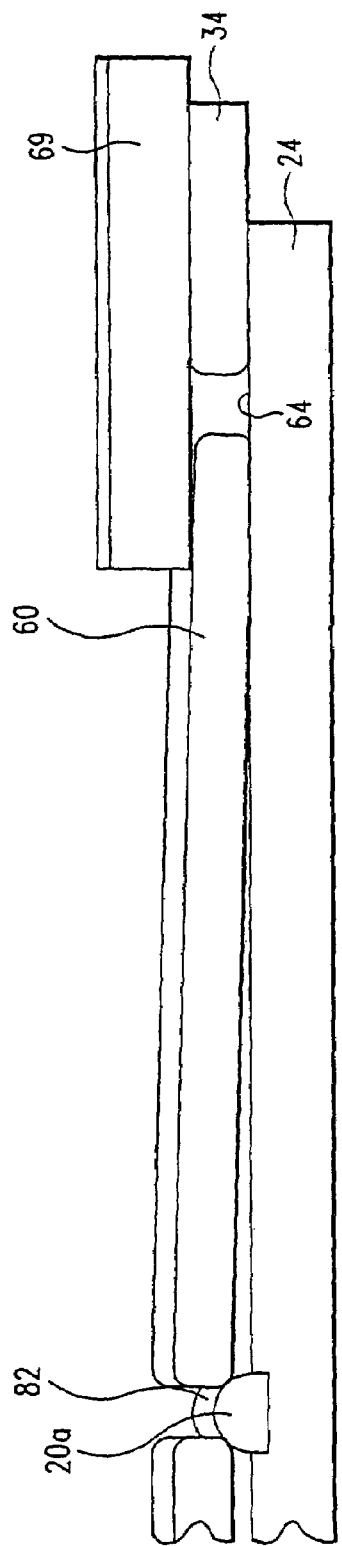
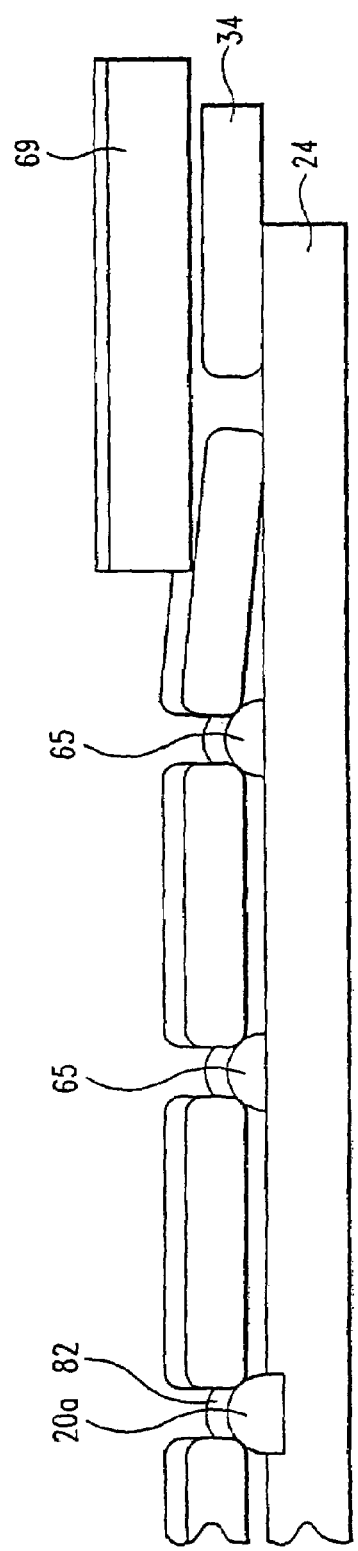
FIG. 3a
FIG. 3b

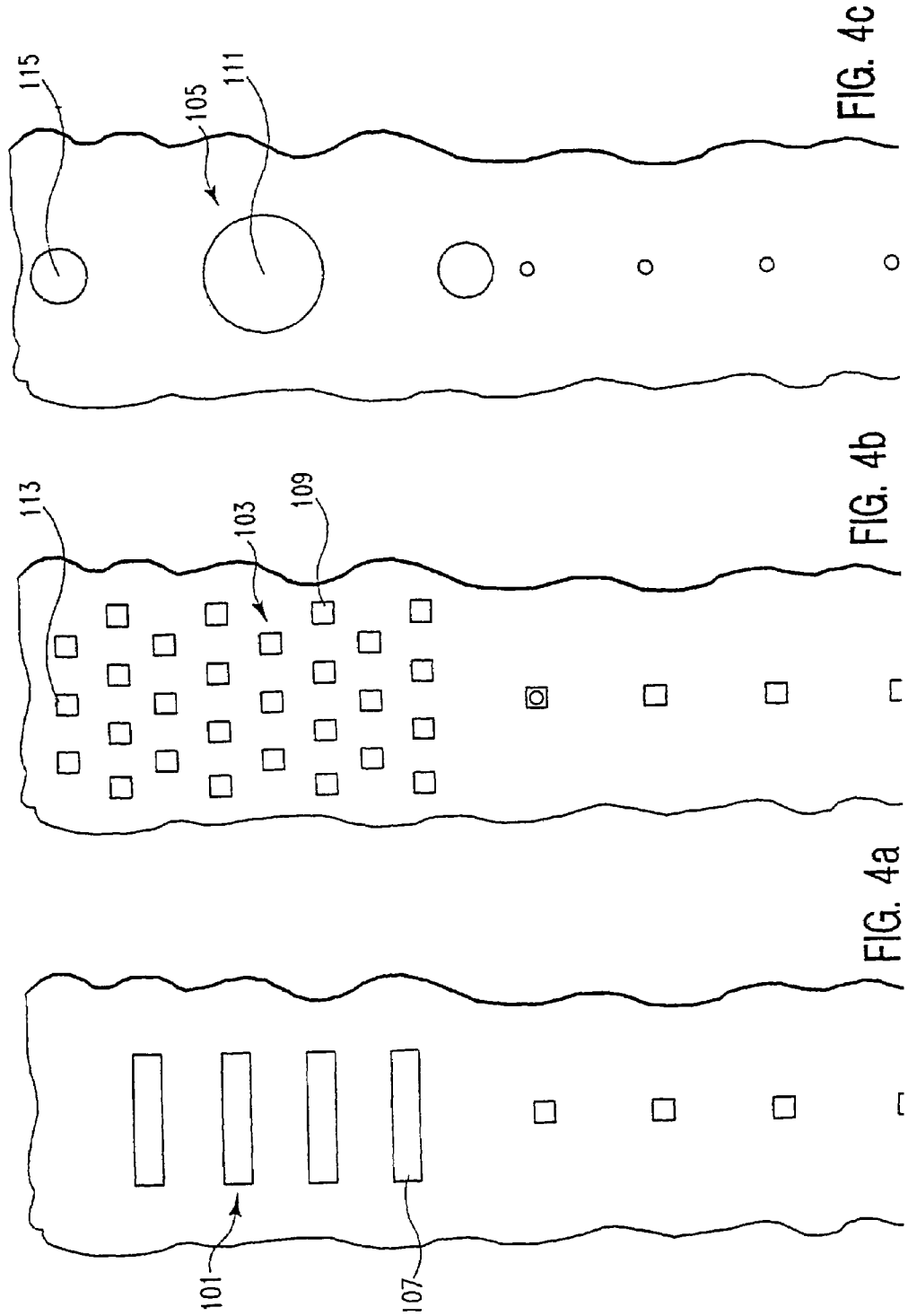

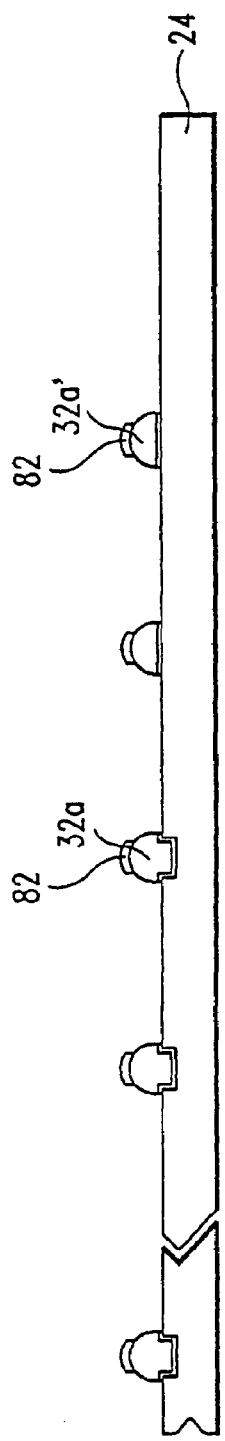
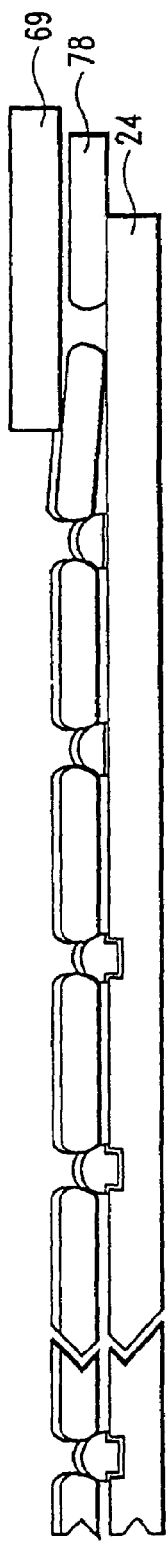
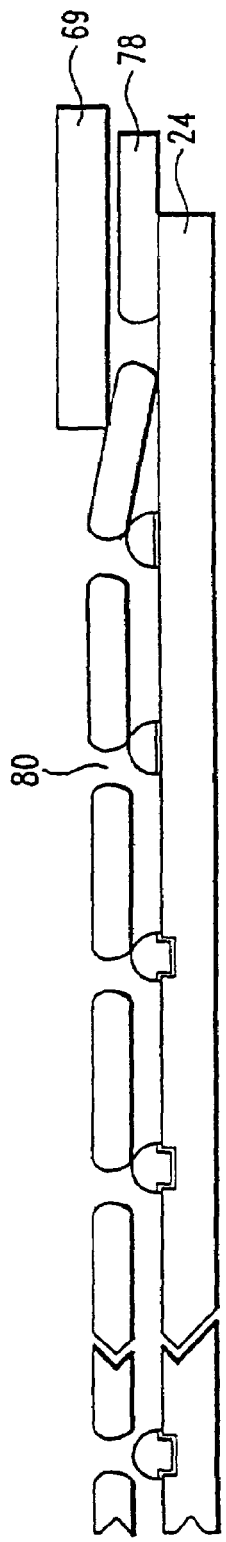
FIG. 8c
FIG. 8b
FIG. 8a

WAFER INTEGRATED RIGID SUPPORT RING

This application is a divisional of application Ser. No. 10/302,412, filed Nov. 22, 2002, which is now U.S. Pat. No. 6,706,621, that application was a divisional of application Ser. No. 09/422,697, filed Oct. 21, 1999, which was a abandoned.

FIELD OF THE INVENTION

This invention generally relates to semiconductor wafers having solder bump interconnects. More particularly, it relates to evaporated solder bumps. Even more particularly, it relates to an improved shadow mask for evaporating solder bumps.

BACKGROUND OF THE INVENTION

Semiconductor wafer fabrication concludes with forming contacts to access circuitry on the wafer. Increasingly flip chip bonds formed of solder bumps are being used for contacts since a very large number of contacts can be provided in an area array. Evaporation or sputtering through a shadow mask made of a thin sheet of molybdenum has long been used for forming the solder bumps.

Traditionally, a high reliability solder bump connection has been achieved by providing a solder bump with a very high lead content. This has been acceptable for solder bump contacts to ceramic substrates that can tolerate the high temperature needed to melt high lead content solder. However, for connection to low temperature substrates, such as plastic substrates, a composition that provides a low melting point tin cap on a standard reflowed high-lead composition solder bump is desired, as described in commonly assigned U.S. Pat. No. 5,729,896, to Dalal et al., incorporated herein by reference. A two-mask process for forming these tin cap solder bumps is described in commonly assigned U.S. Pat. No. 5,922,496, to Dalal et al., incorporated herein by reference. However, the present inventors found that the second mask for tin cap deposition damages high melting point solder bumps formed in the first masking step. Thus, a solution is needed that improves the process to avoid damage to solder bumps formed in the first masking step.

In addition, the invention also provides a solution to a second problem. After the first shadow mask has been positioned, the wafer is subjected to a plasma etching step to remove oxide that may be covering contact pads, to reduce contact resistance between contact pads and ball limiting metallurgy that underlies the solder bump. Portions of the wafer that are covered by the molybdenum mask are protected from the plasma while contacts that are located under holes in the mask are subjected to the plasma and have oxide removed. However, uniformity of oxide removal across the wafer has been a problem, and some regions of the wafer were found to have lower contact resistance than others. Thus, a better solution for plasma etching is required to provide a way to provide more consistent low contact resistance across the wafer. A solution that both provides substantially improved contact resistance uniformity as well as avoiding damage to solder bumps if a second masking and deposition step is used, is provided by the following invention.

SUMMARY OF THE INVENTION

It is therefore an object of the present invention to provide a wafer having perimeter chips wherein additional dummy solder bumps are located adjacent each of the perimeter chips.

It is a further object of the present invention to provide a shadow mask for depositing ball limiting metallurgy and solder bumps on chips on a wafer wherein additional holes are provided in the mask adjacent all perimeter chips.

It is a further object of the present invention to improve uniformity of plasma etching of chip contacts through holes in a shadow mask by providing additional holes in the mask adjacent all perimeter chips.

It is a further object of the present invention to avoid damage to chip solder bumps on a wafer when a shadow mask is placed on the wafer for a second solder deposition by providing additional solder bumps on the wafer adjacent all perimeter chips.

It is a feature of the present invention that lanes are provided in the additional solder bumps to facilitate dicing of the wafer.

It is a feature of the present invention that a fully populated array of additional solder bumps is provided between dicing lanes at least extending to an exclusion zone along a periphery of the wafer even if the solder bumps array on product chips is not fully populated.

It is an advantage of the present invention that electric field uniformity is maintained to a radius extending beyond perimeter chips on the wafer.

It is an advantage of the present invention that contact resistance uniformity is improved and that contact resistance of perimeter chips is reduced.

It is an advantage of the present invention that damage to solder bumps on perimeter chips is reduced or avoided when a second solder deposition is provided through a second shadow mask since the additional solder bumps provide support for the second shadow mask.

These and other objects, features, and advantages of the invention are accomplished by a wafer that comprises an array of chips having contacts. The contacts comprise solder bumps. The array of chips includes perimeter chips extending along a periphery of the wafer. Additional dummy solder bumps are located adjacent most of the perimeter chips wherein the additional dummy solder bumps are for improving contact processing of the perimeter chips.

The improved contact processing includes avoiding damage during a second masking step to deposit additional solder on the solder bumps. It also includes lower contact resistance between chip metal and ball limited metallurgy as a result of superior sputter etching of contacts located along the perimeter of the chip array. Ball limited metallurgy includes metals such as chromium, copper, and gold.

A second aspect of the invention is a shadow mask, comprising an array of holes in the shadow mask corresponding to contacts on an array of chips on a wafer. The array of chips includes perimeter chips extending along a periphery of the wafer. Additional dummy holes are in the shadow mask located adjacent holes corresponding to most of the perimeter chips. The additional dummy holes are for improving contact processing of the perimeter chips.

BRIEF DESCRIPTION OF THE DRAWINGS

The foregoing and other objects, features, and advantages of the invention will be apparent from the following detailed description of the invention, as illustrated in the accompanying drawings, in which:

FIG. 1b. is cross sectional view of the wafer of FIG. 1a showing oxide between wafer metal lines and terminal metals in solder bump contacts located on perimeter chips of the wafer of FIG. 1a;

FIG. 3a is a cross sectional view of a second shadow mask clamped to a wafer after solder bumps have been reflowed showing damage to solder bumps on perimeter chips of the wafer;

FIG. 3b is a cross sectional view of a second shadow mask clamped to a wafer after solder bumps have been reflowed having additional dummy solder bumps showing damage to the additional dummy solder bumps but no damage to solder bumps on perimeter chips of the wafer;

FIG. 4c is a top view of alignment marks printed on the wafer for alignment with either the alignment bars of FIG. 4a or the alignment holes of FIG. 4b;

FIG. 4a' is a top view of the wafer alignment marks of FIG. 4c as they appear in x-ray view along with the alignment bars of FIG. 4a;

FIG. 4b' is a top view of the wafer alignment marks of FIG. 4c as they appear in x-ray view along with the alignment holes of FIG. 4b;

FIG. 8a is a cross sectional view of the wafer after the step shown in FIG. 7e has been completed and after a second shadow mask is clamped to the wafer for a tin cap deposition;

FIG. 8b is a cross sectional view of the wafer and second shadow mask after the tin cap deposition is complete; and FIG. 8c is a cross sectional view of the wafer of FIG. 8b after the second shadow mask has been removed, leaving tin-capped solder bumps.

DETAILED DESCRIPTION OF THE INVENTION

Figure 1A:
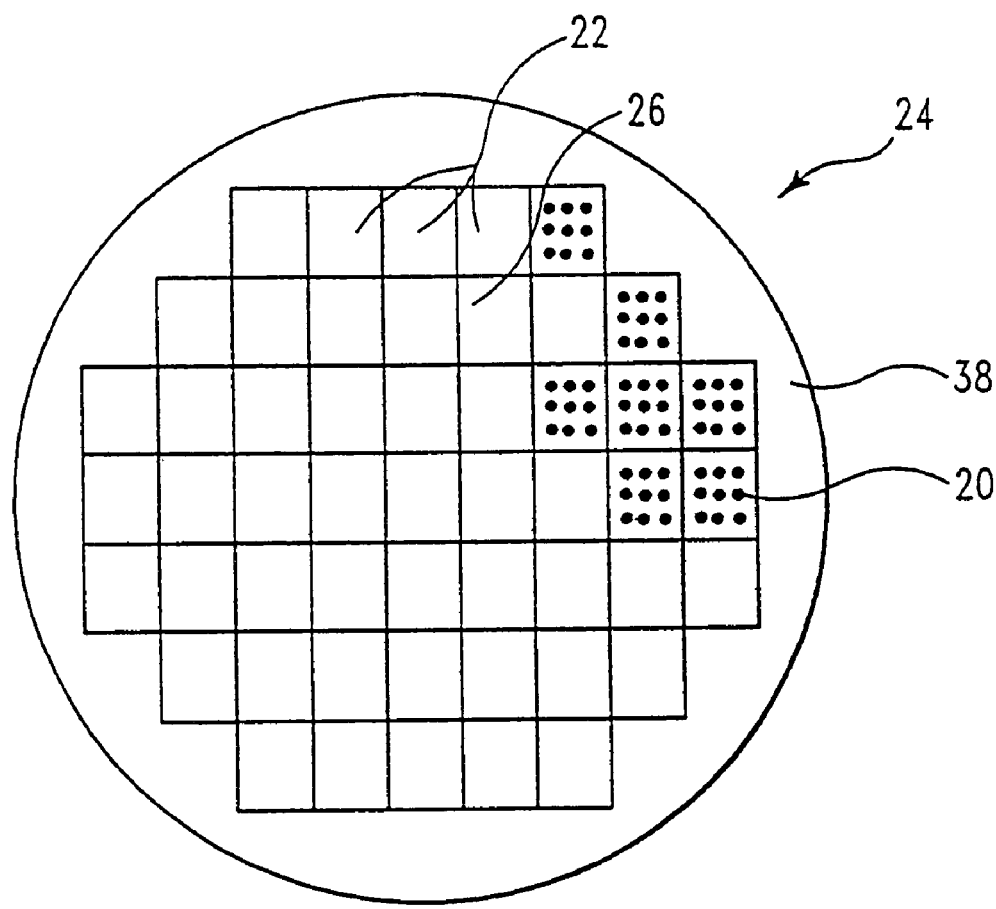
FIG. 1a is a top view of a wafer comprising chips having solder bumps.
Figure 1B:
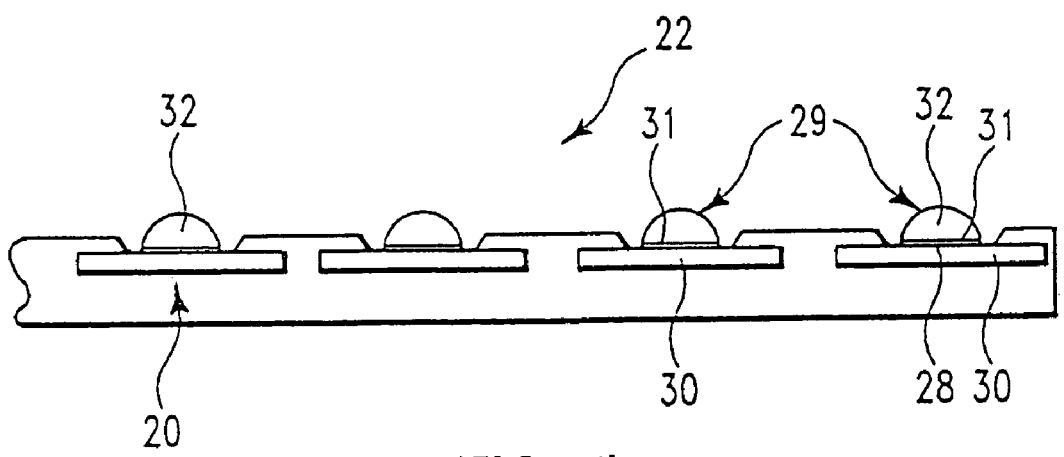

The present inventors discovered that contacts 20 on perimeter chips 22 of semiconductor wafers in normal production, such as wafer 24, had higher contact resistance than central chips 26, as shown in FIG. 1a. They found that the higher contact resistance was related to oxide 28 being left in contacts 20 on perimeter chips 22 during the argon plasma etching step that preceded vacuum deposition of terminal metals 29 in contacts 20, as shown in FIG. 1b. Oxide 28 was located at the interface between final metal layer 30 and the first layer of terminal metal, chromium layer 31. Perimeter chips 22 are the outermost fully printed chips on wafer 24. Terminal metal 29 also includes copper and gold on chromium layer 31 and solder bump 32. Final metal layer 30 is formed of copper, aluminum, or another conductor.

Figure 2A:
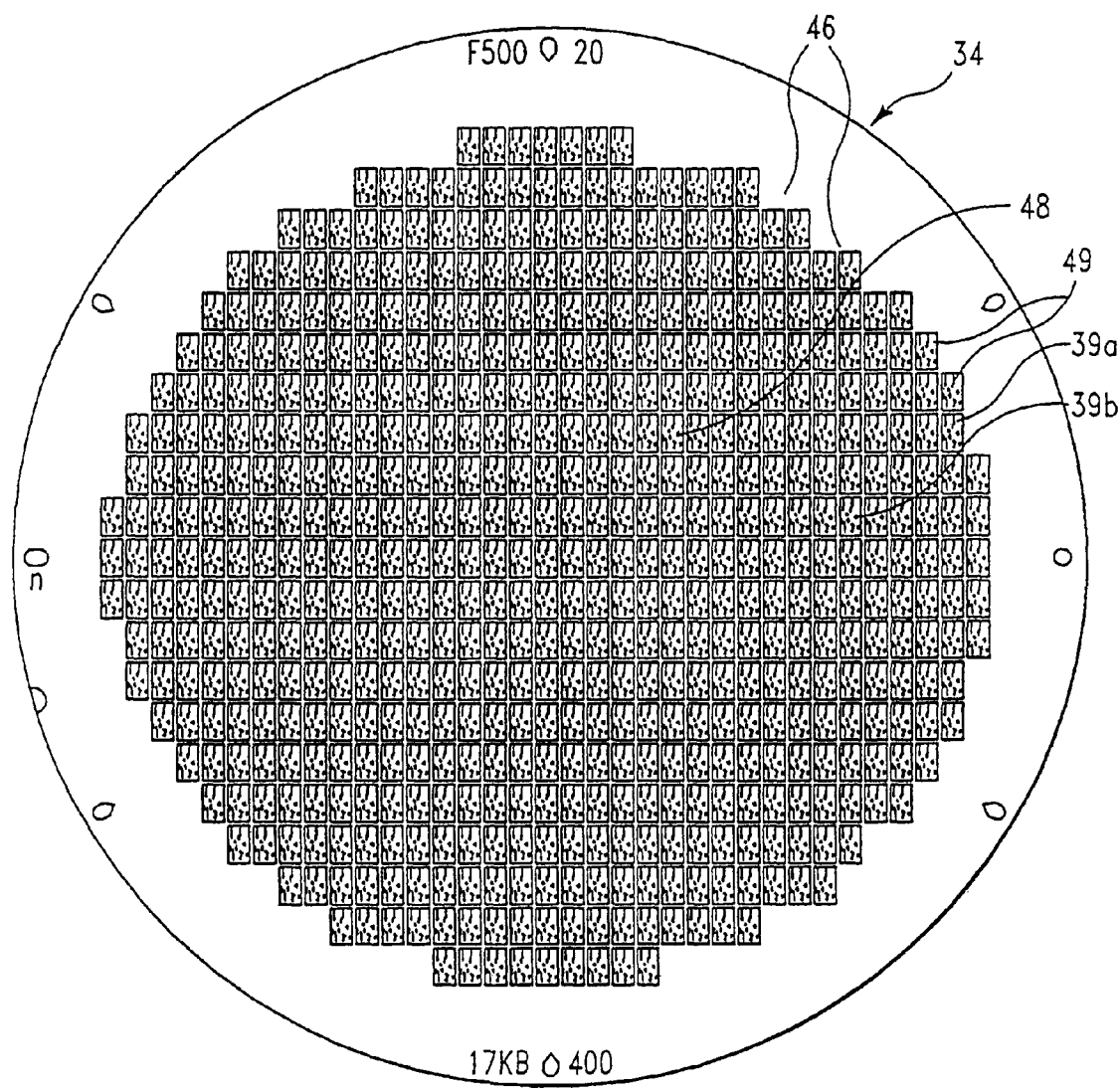
FIG. 2a is a top view of a prior art shadow mask comprising holes in a molybdenum sheet used to vacuum deposit terminal metals on a wafer.

The inventors recognized that oxide 28 was not being fully removed from metal layer 30 around periphery 38 of wafer 24 during the argon plasma etching step. They further recognized that plasma power was lower at periphery 38 of wafer 24 because the geometry of shadow mask 34 was different at holes 39a along mask periphery 46 then at holes 39b in mask central region 48, as shown in FIG. 2a. One explanation is that plasma power increases proportionally with current density. The current density was lower at mask periphery 46 because the surface area of mask 34 exposed to plasma was larger in mask periphery 46 since there were no holes in mask 34 for contacts beyond perimeter chip region 49 of mask 34 corresponding to perimeter chips 22 on wafer 24. Since the absence of holes meant a higher area of mask conductor, there was a lower current density. The lower current density provides a lower power density, and therefore less etching in the local area around periphery 46 of mask 34. Alternative explanations are also possible. But the inventors found that by providing additional holes in mask 34 to eliminate the partially isolated holes at the edge of perimeter chips, contact cleaning was substantially improved.

Figure 2B:
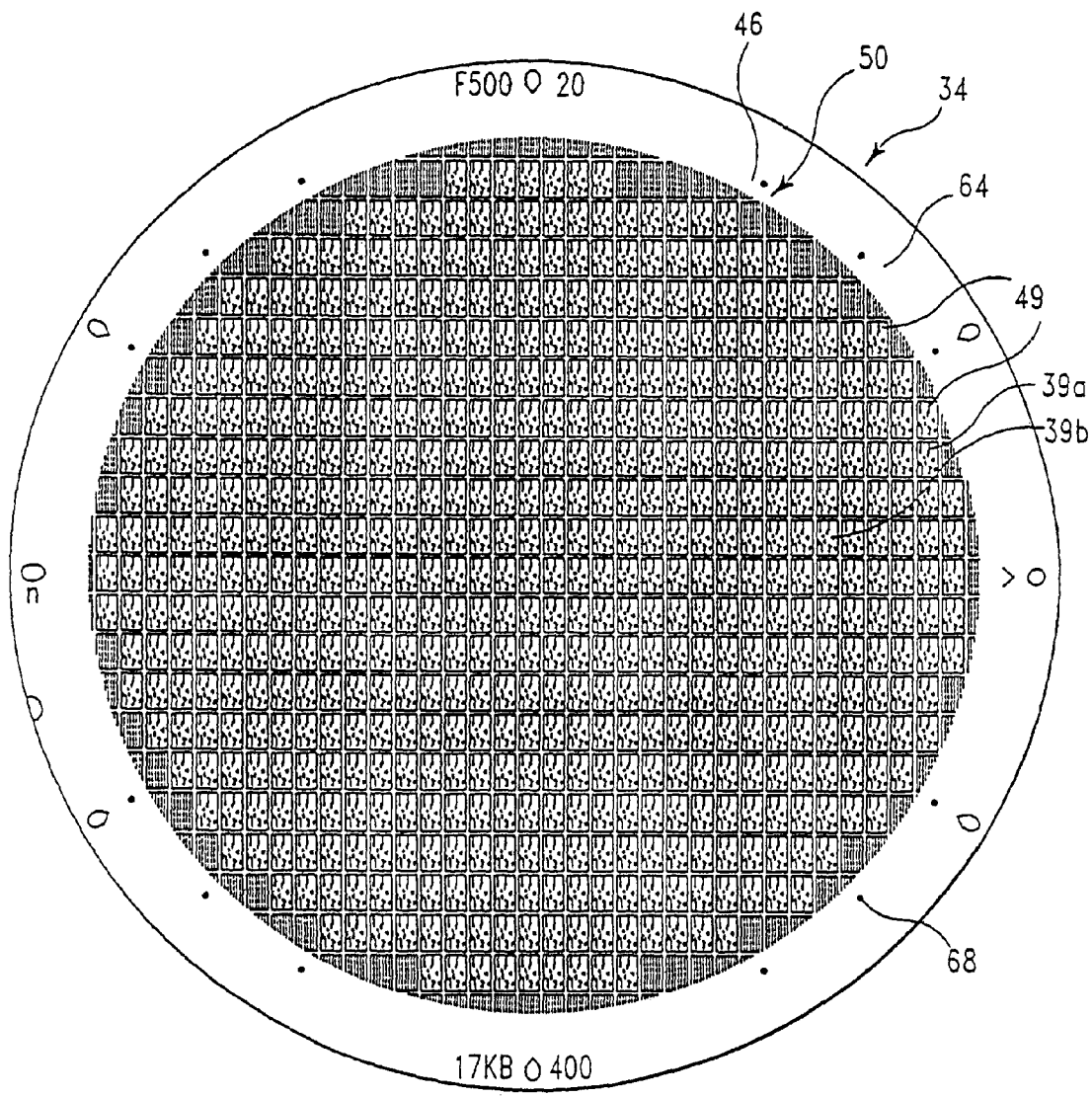
FIG. 2b is a top view of a shadow mask of the present invention comprising the holes in the mask of FIG. 2a plus additional holes outside the location of perimeter chips of the wafer.
Figure 2C:
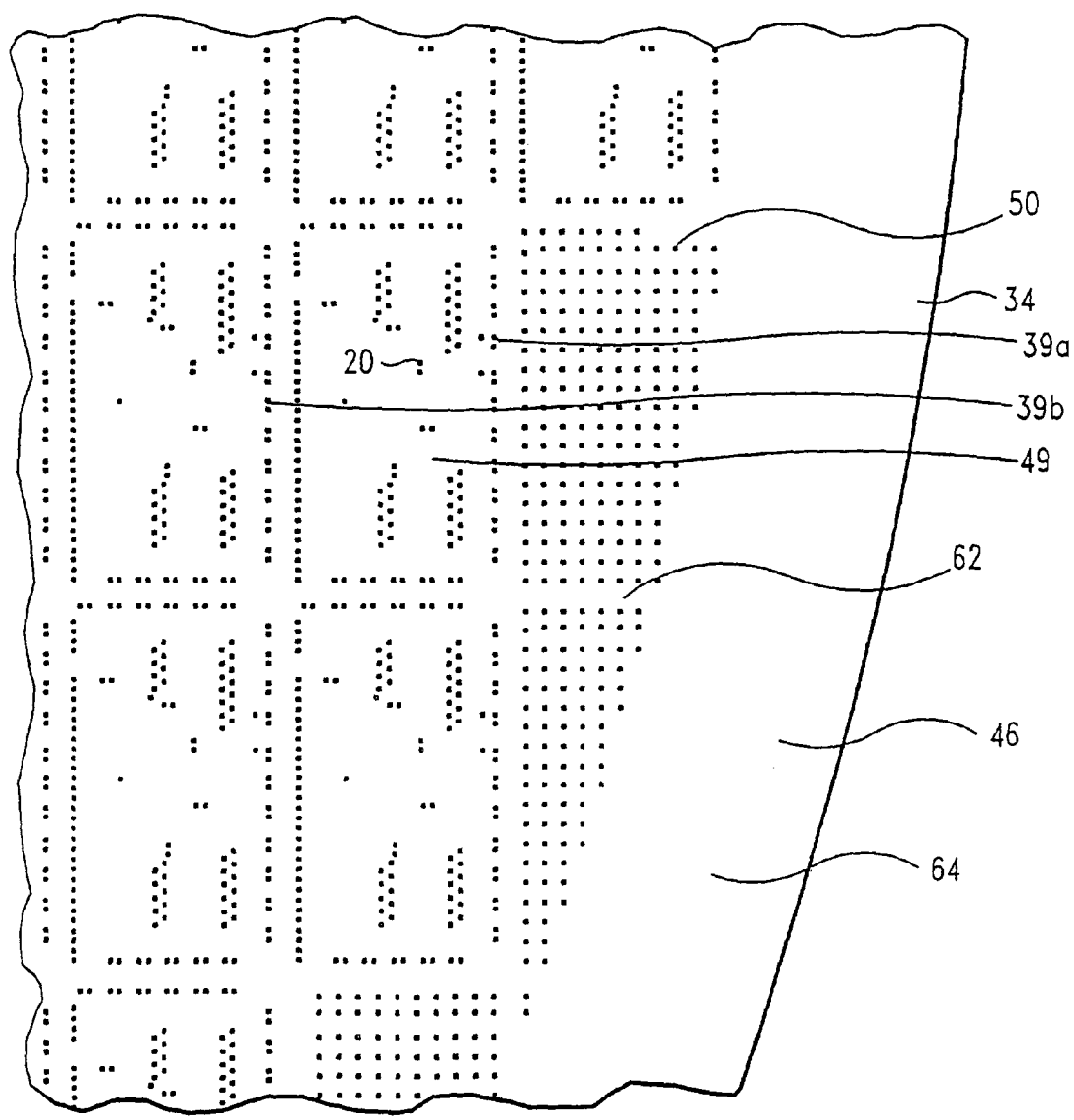
FIG. 2c is an expanded view of a portion of FIG. 2b.

The inventors found experimentally that mask 34' with additional holes 50 in mask periphery 46, as shown in FIGS. 2b and 2c, reduced contact resistance of contacts 20 of perimeter chips 22, solved the contact resistance non-uniformity problem, significantly improved etching of oxide 28 in contacts 20 of perimeter chips 22, and increased yield.

With additional holes 50 in shadow mask 34', oxide layer 28 was removed as well on perimeter chips 22 as on more central chips 26 of wafer 24. The inventors found that local plasma power in perimeter chip region 49 is increased by the presence of additional holes 50 in shadow mask 34' consistent with the increased current density holes 50 provide. The inventors found that the additional holes in the mask adjacent perimeter chip region 49 improves the uniformity of plasma over wafer 24 so perimeter chips 22 experience about the same power density as central chips 26. Additional holes 50 permit the plasma electric field to be uniform to a radius extending beyond perimeter chip region 49 of mask 34, thereby improving contact etching uniformity across wafer 24. The result is that the contact resistance of perimeter chips 22 is reduced and cross-wafer contact resistance uniformity is significantly improved.

Even before discovering the improved oxide removal with additional holes 50 in mask 34' the inventors discovered that additional solder bumps 32' located outside perimeter chips 22 on wafer 24 solve a problem they discovered while fabricating wafers with tin capped solder bumps. The inventors found that solder bump contacts 32 located on perimeter chips 22 of wafer 24 are frequently damaged during clamping of second shadow mask 60 (FIG. 3a) for deposition of a low temperature solder 82 on top of first reflowed solder bump contact 32 in the tin-cap process described in commonly assigned U.S. Pat. No. 5,729,896, incorporated herein by reference. They also found that solder bump damage could be avoided by providing rows of additional solder bumps 32' on wafer 24 adjacent all perimeter chips 22. Additional solder bumps 32' provide support for second shadow mask 60 outside perimeter chips 22. They found that while some of these additional bumps 32' may be damaged, needed solder bumps 32 on functional perimeter chips 22 are protected from damage by their presence. The additional solder bumps are formed by providing additional holes 50 in shadow mask 34', as described herein above. Thus, the inventors found that one solution, providing additional holes 50 in mask 34, solves two completely independent problems. Whereas the contact resistance problem is one that affects all solder bump wafers, the solder bump damage problem is one that only affects wafers with solder bumps that will receive the tin cap.

Damage to solder bumps on perimeter chips 22 arises during clamping of second shadow mask 60 to wafer 24 before the tin cap vacuum deposition, as shown in FIG. 3a. In ordinary processing, clamp 69 flattens mask 60 against bare surface 64 of wafer 24. First few rows of reflowed solder bumps 32a can be damaged as a result of the second shadow mask 60 being bent downwards by clamped ring 69. This damage is avoided, as shown in FIG. 3b, if additional dummy solder bumps are provided in space adjacent perimeter chips 22 on wafer 24. Now these additional dummy solder bumps 65 may be damaged by mask 34', but chip solder bumps 32a remain in pristine condition. Additional dummy solder bumps 65 are formed by providing additional holes 50 in the same shadow mask 34' used for depositing original solder bump contacts 32.

The inventors also found that providing dicing lanes 62 in the array of additional solder bumps 32' facilitates dicing. Thus, the dicing lanes between product chips are continued through the additional solder bumps so additional solder bumps do not interfere with the dicing saw blade.

Figures 4A, 4B:
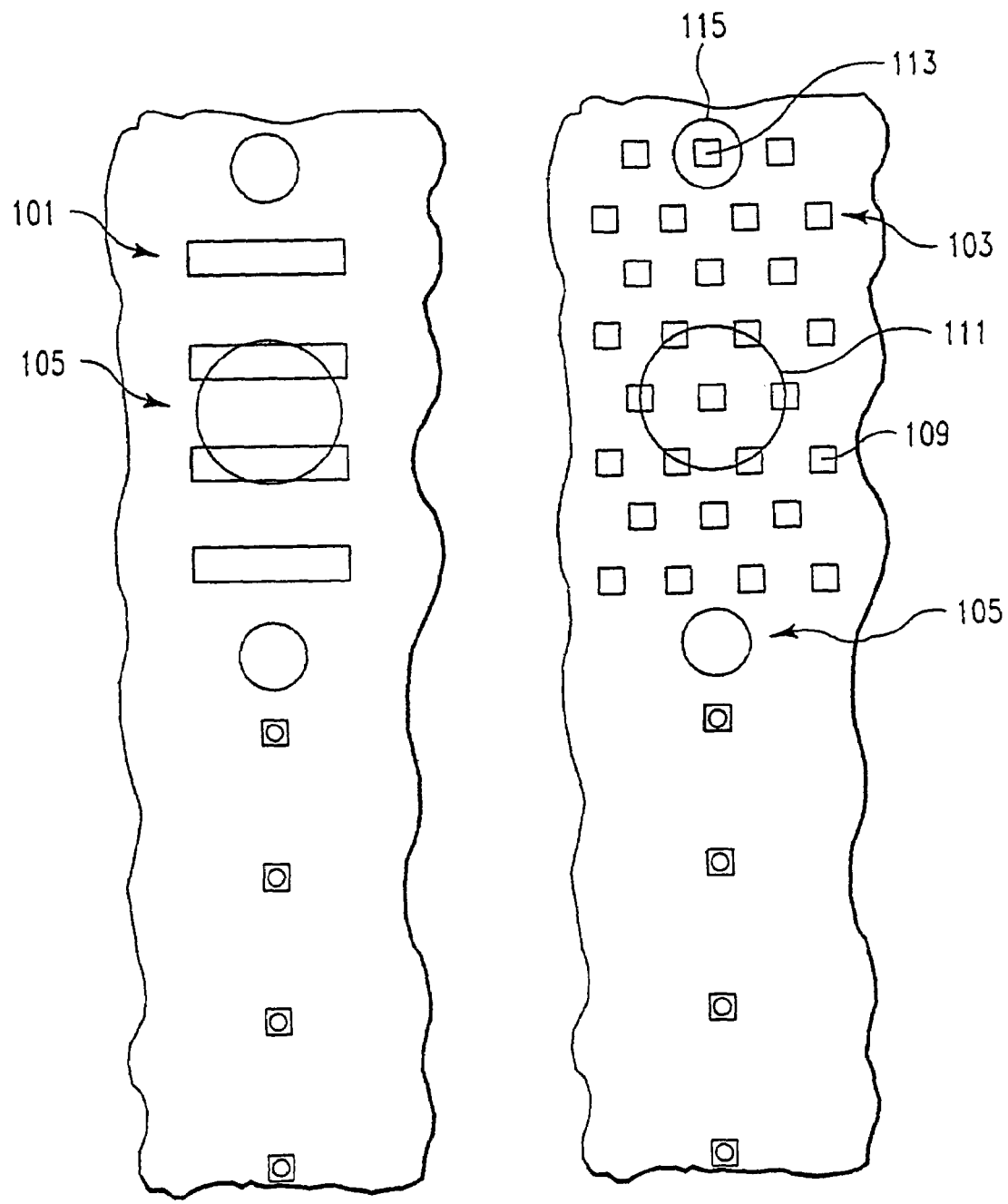
FIG. 4a is a top view of prior art alignment bars, located outside the location of perimeter chips of the wafer, to align mask to wafer.
FIG. 4b is a top view of alignment holes of the present invention used to align mask to wafer.

Similarly, the array of additional solder bumps 32' is omitted in regions needed for other structures, such as bar pattern 101 or hole pattern 103 on mask 34 for aligning mask 34 to wafer 24, as shown in FIGS. 4a, 4b. Mask 34 with bar pattern 101 or hole pattern 103 is placed above wafer 24 to align with pattern 105 on wafer 24, as shown in FIG. 4c. Pattern 105 on wafer 24 is formed with the same photolithography mask used to open contacts 20. One problem with prior art bar pattern 101 is that solder bumps formed after reflow are much taller than contact solder bumps, and they may interfere with probes used for testing wafer 34. The solder bumps are higher because the length and width of bars 107 of bar pattern 101 is much larger than the diameter of ordinary contact solder bumps 32a, and the solder beads up after reflow. The inventors found that hole pattern 103 is advantageous since solder height of the bumps formed on wafer 24 after reflow is identical with height of other solder bumps 32a on wafer 24. Also, visibility of pattern 105 through hole pattern 101 was found to be better than through bar pattern 103. Holes 109 of hole pattern 103 are provided close together so that they overlap edges of circular pattern 105 on wafer 24. Hole 113 of hole pattern 103 can be centered in circular pattern 115 on wafer 24. Each of these factors results in better course alignment of mask 32' to wafer 24 than could be achieved with the prior art bar pattern. Preferably holes of hole pattern 103 are about the same size or smaller than holes for product chips.

Figure 2D:
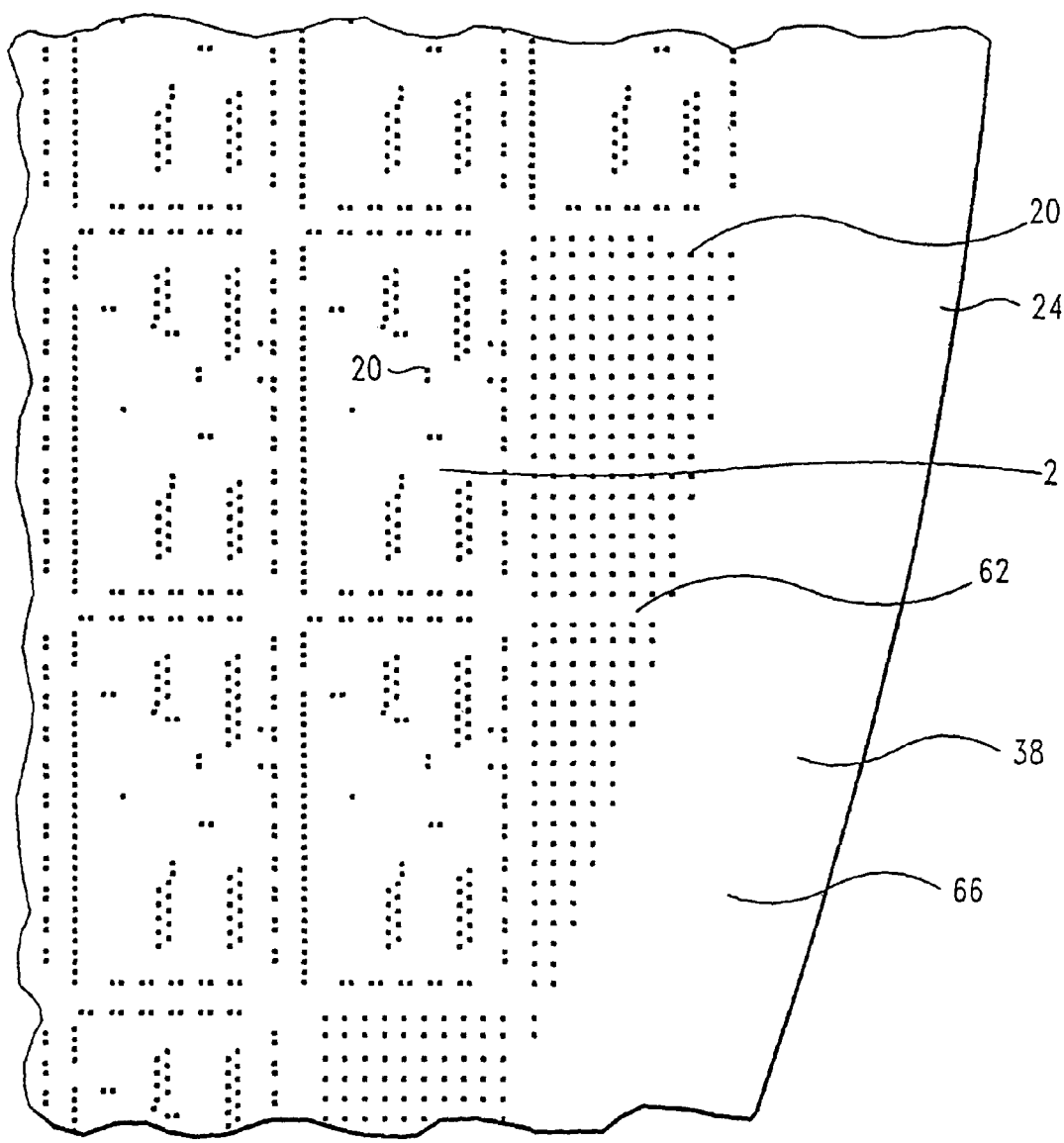
FIG. 2d is a top view of the wafer corresponding to the mask portion shown in FIG. 2b.
Figure 2E:
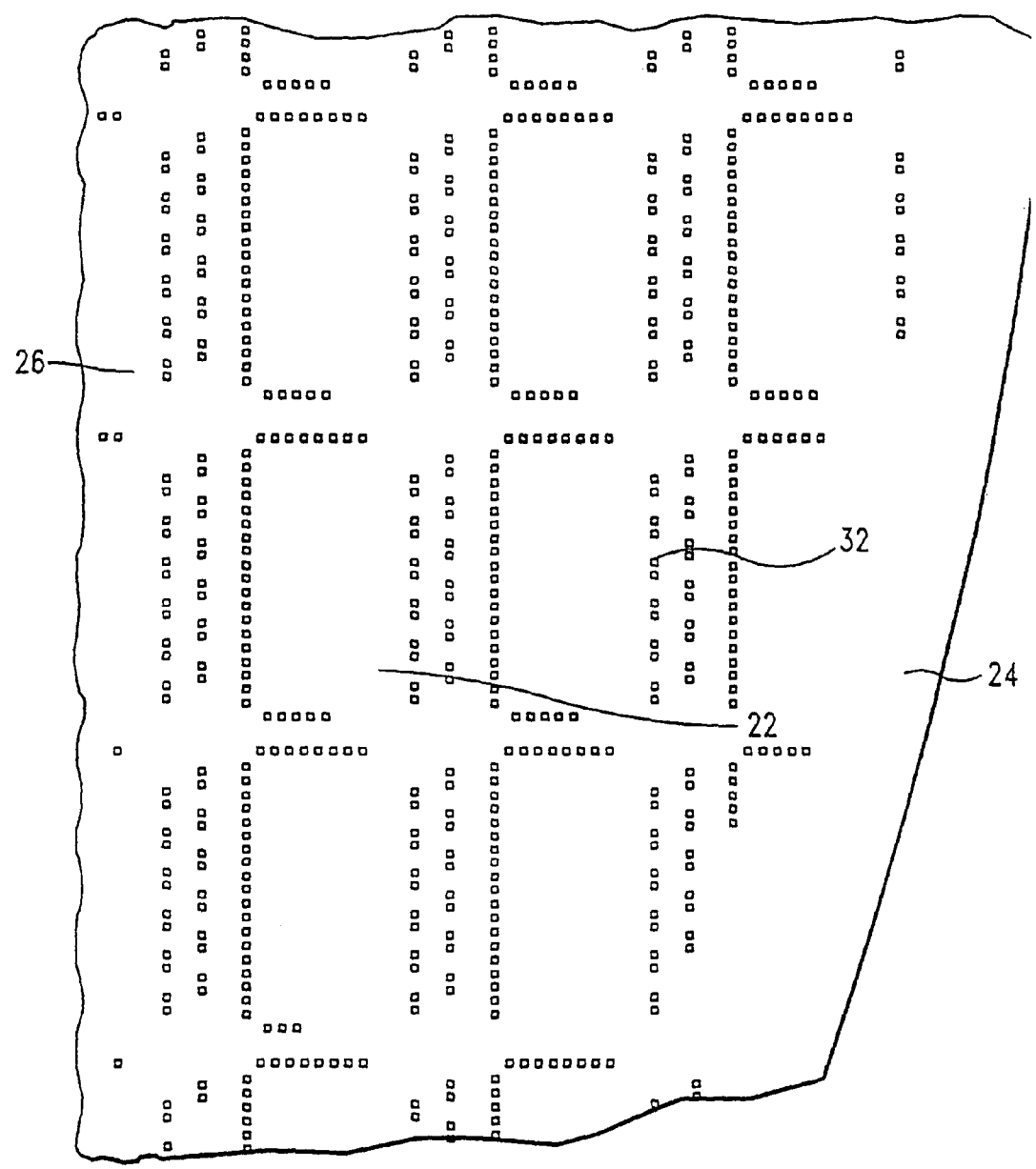
FIG. 2e is a top view of a portion of the wafer with an array of additional solder bumps corresponding to the arrays found on product chips.

They also found that providing exclusion zone 64 beyond additional holes 50 of mask 34' facilitates handling wafer 24 with a vacuum tool that precisely places wafer 24 in position for dicing. Exclusion zone 64 on mask 34, 34' keeps solder bumps out of exclusion region 66 along periphery 38 of wafer 24. They also found that populating all positions in the array of additional solder bumps between dicing lanes and extending to exclusion zone 66 provides a solder bump array on wafer 24 that gives excellent support for the second shadow mask, even if the solder bumps on chips 22, 26 do not have a fully populated array of solder bumps. They also found that the higher population of holes 50 in mask 34' does not adversely affect contact resistance uniformity. Of course, the arrangement of holes in mask 34" and additional solder bumps 32' on wafer 24 can correspond to the arrangement for product chips 22, 26, as shown in FIG. 2e. The pattern of holes for each of these partial chips 32' extends to the exclusion zone. The exclusion zone shown in FIGS. 2b, 2c, 2d can be omitted if wafer handling is accomplished other than by vacuum from the top.

One of the steps in fabrication of shadow mask 34, 34' is inspection, and the present inventors found that the presence of additional holes 50 can interfere with aligning the mask for inspection by an automatic inspection tool. This inspection tool, known as a C4 mask inspection tool, Model B, is described in commonly assigned U.S. Pat. No. 4,570,180, incorporated herein by reference. Alignment of the C4 mask inspection tool to the mask for inspection requires the presence of a set of holes arranged in a square corner pattern. This pattern was ordinarily available at edges of perimeter chips on prior art mask 34 but additional holes 50 on mask 34' can obliterate the square corner pattern. In some cases the removal of some additional holes 50 to create mask dicing lanes 62' provides the square corner arrangement needed for the C4 mask inspection tool alignment step. However, this depends on the particulars of the design, and the square arrangement is not always produced.

Figure 5:
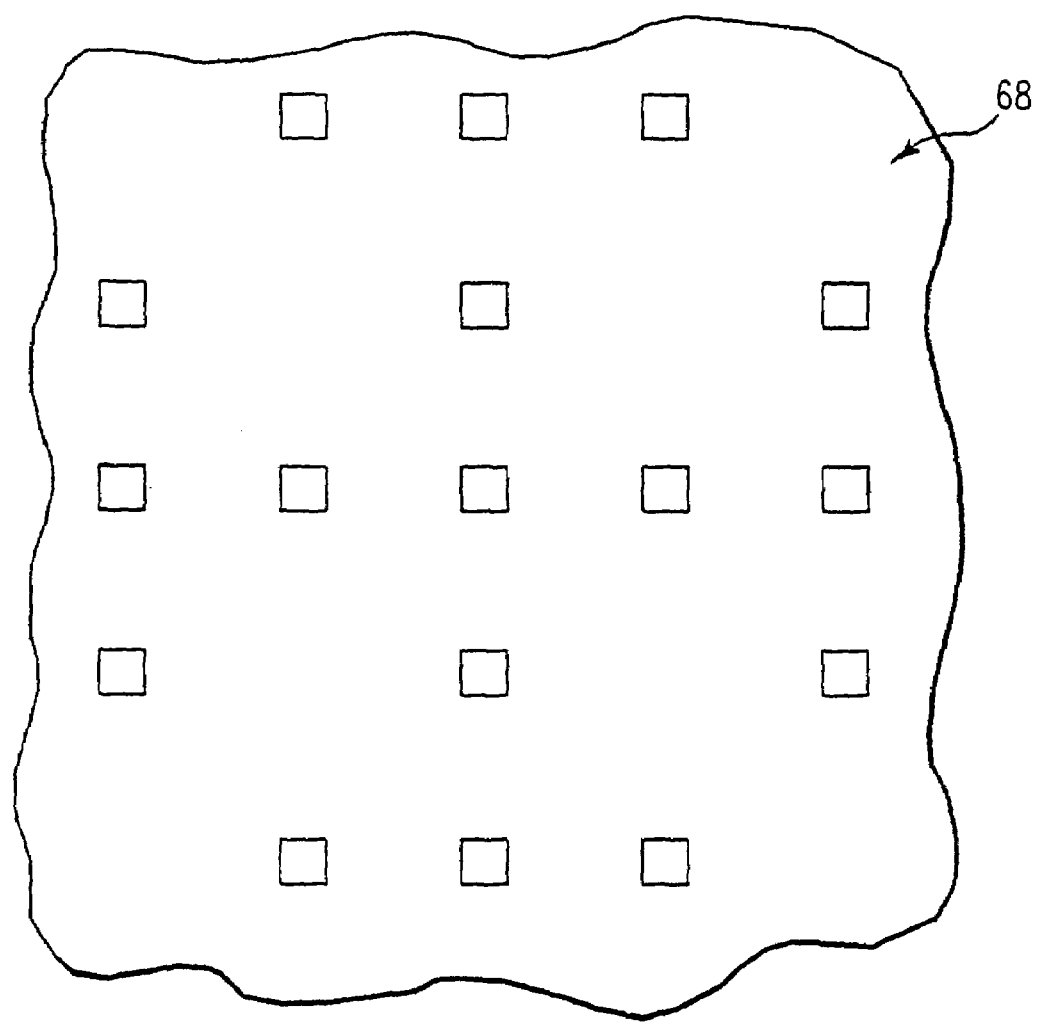
FIG. 5 is a top view of a C4 mask inspection tool fiducial, located outside the location of perimeter chips of the wafer on a mask of the present invention and beyond the exclusion zone for use to align for mask inspection.

A solution adopted by the inventors of the present invention was to add yet more additional holes to the mask in a pattern, shown in FIG. 2b and, in higher magnification, in FIG. 5. The additional holes are used to align the tool for inspection, and this pattern is known as C4 mask inspection tool fiducial 68. As seen in FIG. 2b, a number of these fiducials are placed around the perimeter of the mask to facilitate alignment. The inventors recognized however, that it was undesirable if the C4 mask inspection tool fiducial actually printed solder bumps on the wafer periphery exclusion region since that would interfere with later wafer vacuum handling to place wafer 24 on an adhesive membrane for dicing. Thus, the inventors placed the C4 mask inspection tool fiducials on locations of the mask that would be covered by clamped ring 69 that holds mask 34' to wafer 24. The C4 mask inspection tool fiducials were thereby placed within the range recognized by the C4 mask inspection tool inspection tool but that was outside the mask region exposed to vacuum deposition since those locations were covered by a guard ring. The C4 mask inspection tool fiducials are located in the same place for all designs and are included in the basic frame data for all masks along with other standard features.

Figure 6:
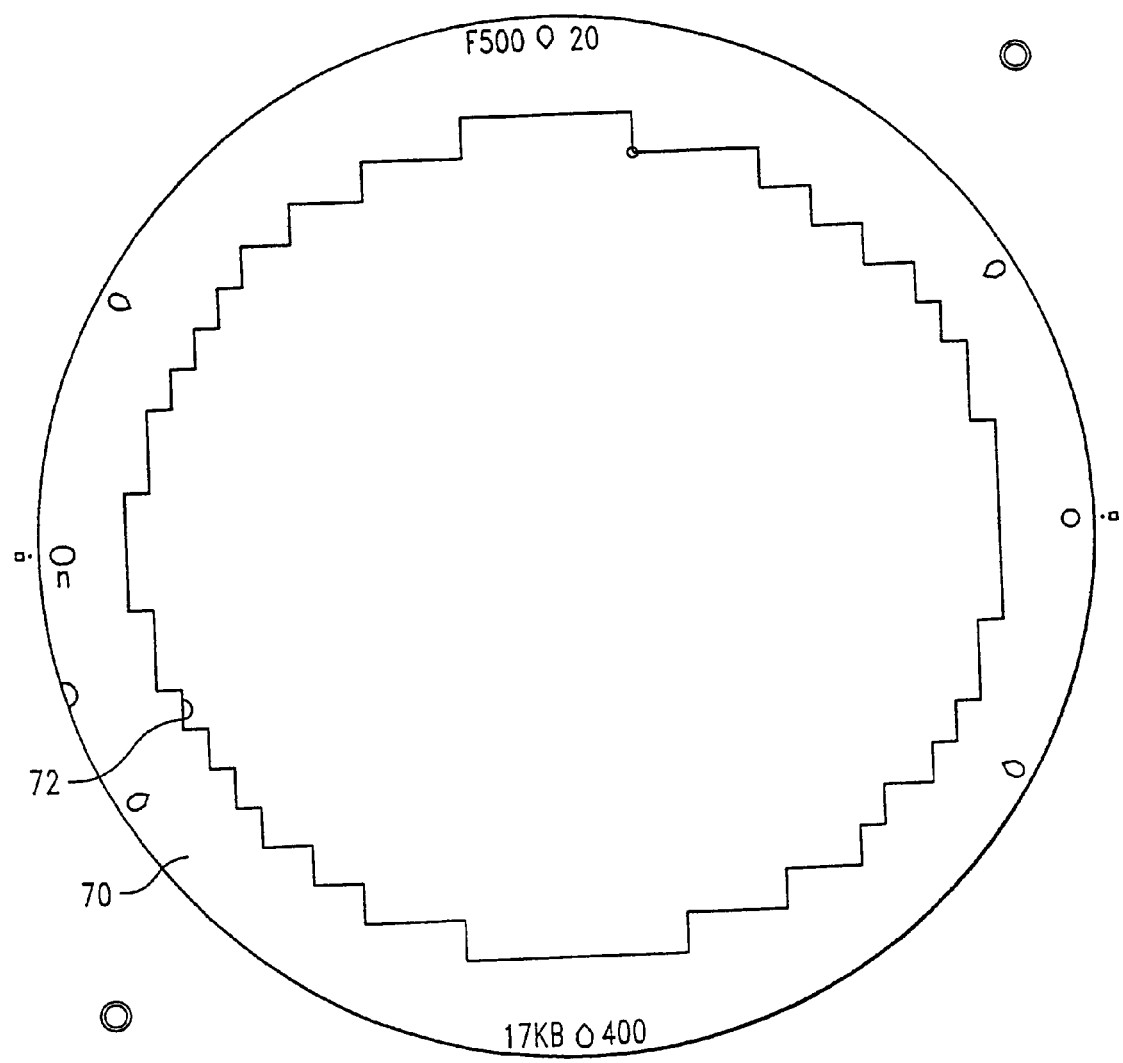
FIG. 6 is a top view of a mask to stack on a shadow mask of the present invention in an alternate method of aligning for mask inspection.

An alternate solution that would work equally well would be to provide a cover for the additional holes in the mask during mask inspection. Such a cover for the additional holes could be formed with masking tape. It could also be formed with ring 70 having cutout 72 matching the shape of the outside edge of the perimeter chips 22, as shown in FIG. 6. Ring 70 would only be used during the mask inspection step. Ring 70 is designed from mask design data, using standard circuit board generating software, such as PAR software, from Infinite Graphics. Yet another solution is to add holes for additional complete dummy chips that fit between holes for active perimeter chips 22 and exclusion zone 64. These complete dummy chips would provide the right angle pattern needed for the C4 mask inspection tool inspection tool. Partial chips extending to exclusion zone 64 also solve the support problem for the second shadow mask and the plasma power problem but these do not generally provide the right angle pattern needed for C4 mask inspection tool inspection, as shown in FIG. 2d. Thus, partial chips can be used where C4 mask inspection tool inspection is not needed or is otherwise accommodated.

Figure 7A:
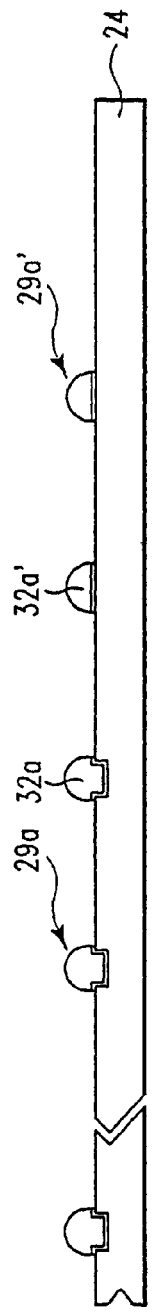
FIG. 7a is a cross sectional view of a shadow mask clamped to a wafer in preparation for sputter cleaning and terminal metals deposition.
Figure 7B:
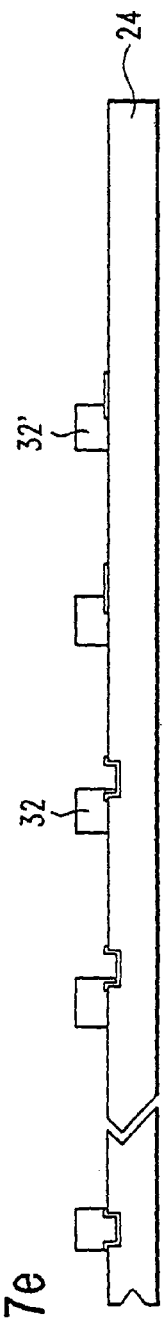
FIG. 7b is a cross sectional view of the shadow mask and wafer of FIG. 7a after sputter cleaning and chrome, copper, and gold deposition at elevated temperature.

Mask 34, 34' must have holes located so that they will be in the correct positions over vias when the mask and wafer are at the elevated temperature during the terminal metal 29 deposition. At room temperature, the mask is not so aligned (except in the center of the mask), as shown in FIG. 7a. The highest temperature occurs during the deposition of chrome, copper, and gold terminal metals 29, and masks 34, 34' must have holes 39a, 39b located so that they are generally centered over corresponding contacts 20 on wafer 24 during this high temperature deposition, as shown in FIG. 7b. FIGS. 7a–7e are not to scale and vastly exaggerate the room temperature misalignment of mask 34' and wafer 24. The actual temperature based misalignment is not enough to obscure the contacts during the argon sputter cleaning step performed after wafer 24 is held to mask 32', as shown in FIG. 7a.

Figure 7C:
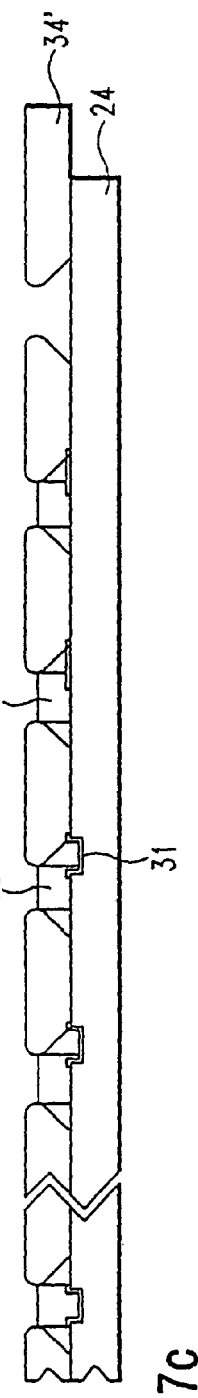
FIG. 7c is a cross sectional view of the shadow mask and wafer of FIG. 7b after lead and tin deposition at a lower temperature than the chrome, copper, and gold deposition.
Figure 7D:
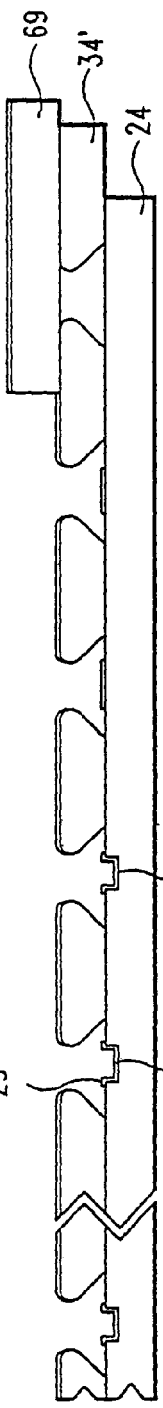
FIG. 7d is a cross sectional view of the shadow mask and wafer of FIG. 7c after the mask has been removed.
Figure 7E:
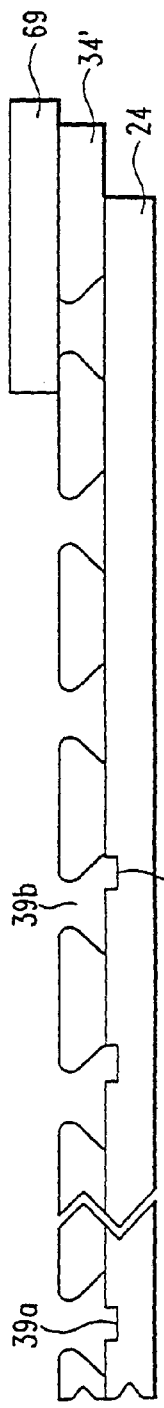
FIG. 7e is a cross sectional view of the shadow mask and wafer of FIG. 7d after the solder has been reflowed.

Mask 34' is held to wafer 24 by ring 69 and by a clamp (not shown). Later, during the solder deposition, the temperature is lower, so the solder bump portion 32, 32' of terminal metal 29 is deposited off center, as shown in FIGS. 7c, and 7d, especially along peripheral regions of wafer 24. FIG. 7d shows terminal metals 29 after mask 32' has been removed. However, the solder bump portion 32, 32' centers itself on the chrome-copper-gold during a subsequent reflow step to provide reflowed solder bumps 32a, 32a' and completed terminal metals 29a, 29a', as shown in FIG. 7e.

Similarly, second shadow mask 78 used for the tin cap deposition must have its holes 80 thermally compensated for the temperature the wafer and mask will achieve during the deposition of tin cap 82 on reflowed solder bumps 32a, 32a', as shown in FIG. 8b. FIG. 8a shows the mask as it is placed on wafer 24 at room temperature showing that second shadow mask holes 84 are not located directly over reflowed solder bumps 32a, 32a', especially along the periphery of wafer 24. After tin cap 82 is deposited, mask 78 is removed, leaving tin cap 82 on reflowed solder bumps 32a, 32a'.

While several embodiments of the invention, together with modifications thereof, have been described in detail herein and illustrated in the accompanying drawings, it will be evident that various further modifications in the design of the combined mark are possible without departing from the scope of the invention. Nothing in the above specification is intended to limit the invention more narrowly than the appended claims. The examples given are intended only to be illustrative rather than exclusive.

What is claimed is:

1. A method of fabricating a shadow mask, comprising the steps of:
   a) providing an array of holes in the shadow mask corresponding to contacts on an array of chips on a wafer, said array of chips including perimeter chips extending along a periphery of the wafer; and
   b) providing a first set of additional holes in the shadow mask located adjacent holes corresponding to most of said perimeter chips wherein said first set of additional holes are for improving contact processing of said perimeter chips wherein said first set of additional holes are omitted in saw blade lanes and in a ring shaped exclusion zone in an area of the shadow mask beyond said perimeter chips.

2. The method of fabricating a shadow mask as recited in claim 1, further comprising the step of inspecting the shadow mask using first set of additional holes along an edge of a dicing lane to align the shadow mask to an inspection device.

3. A method of fabricating a shadow mask, comprising the steps of:
   a) providing an array of holes in the shadow mask corresponding to contacts on an array of chips on a wafer, said array of chips including perimeter chips extending along a periphery of the wafer;
   b) providing a first set of additional holes in the shadow mask located adjacent holes corresponding to most of said perimeter chips wherein said first set of additional holes are for improving contact processing of said perimeter chips wherein said first set of additional holes are omitted in saw blade lanes and in a ring shaped exclusion zone in an area of the shadow mask beyond said perimeter chips, and
   c) inspecting the shadow mask using a pattern of a second set of additional holes, said second set of additional holes located beyond holes corresponding to said perimeter chips, said second set of additional holes for aligning the shadow mask to an inspection device, wherein said pattern of second set of additional holes does not print on the wafer.

4. The method of fabricating a shadow mask as recited in claim 3, wherein said pattern of the second set of additional holes is located so that it will be covered by a guard ring.

5. The method of fabricating a shadow mask as recited in claim 3, further comprising the step of inspecting the shadow mask using a covering for said second set of additional holes.

6. The method of fabricating a shadow mask as recited in claim 5, wherein said covering for said secont set of additional holes is a ring having an inside edge corresponding to outside edges of perimeter chips.

7. A method of fabricating a shadow mask, comprising the steps of:
   a) providing an array of holes in the shadow mask corresponding to contacts on an array of chips on a wafer, said array of chips including perimeter chips extending along a periphery of the wafer; and
   b) providing a first set of additional holes in the shadow mask located adjacent holes corresponding to most of said perimeter chips wherein said first set of additional holes are for improving contact processing of said perimeter chips wherein said first set of additional holes are omitted in a ring shaped exclusion zone in an area of the shadow mask beyond said perimeter chips.

* * * * *